(12) United States Patent
Park

(10) Patent No.: US 9,451,710 B2
(45) Date of Patent: Sep. 20, 2016

(54) BATTERY PACK

(75) Inventor: Sanghun Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 378 days.

(21) Appl. No.: 13/047,592

(22) Filed: Mar. 14, 2011

(65) Prior Publication Data

US 2012/0052331 A1    Mar. 1, 2012

Related U.S. Application Data

(60) Provisional application No. 61/377,392, filed on Aug. 26, 2010.

(51) Int. Cl.
| | |
|---|---|
| *H05K 3/36* | (2006.01) |
| *H01M 2/26* | (2006.01) |
| *H01M 2/22* | (2006.01) |
| *H01M 10/42* | (2006.01) |
| *H01M 2/10* | (2006.01) |
| *H05K 3/34* | (2006.01) |
| *H01M 2/20* | (2006.01) |

(52) U.S. Cl.
CPC ............. *H05K 3/363* (2013.01); *H01M 2/202* (2013.01); *H01M 2/22* (2013.01); *H01M 2/26* (2013.01); *H01M 10/425* (2013.01); *H05K 3/3426* (2013.01); *H05K 2201/09427* (2013.01); *H05K 2201/10037* (2013.01)

(58) Field of Classification Search
CPC .... H01M 10/425; H01M 2/202; H01M 2/22; H01M 2/26; H05K 3/363; H05K 3/3426; H05K 3/2201; H05K 3/09427; H05K 3/10037

USPC .............................................................. 429/7
See application file for complete search history.

(56) References Cited

U.S. PATENT DOCUMENTS

| | | | |
|---|---|---|---|
| 2001/0031395 A1* | 10/2001 | Fukuda et al. ................. | 429/211 |
| 2005/0003704 A1 | 1/2005 | Kasahara | |
| 2008/0090139 A1* | 4/2008 | Hurst et al. .................... | 429/156 |
| 2008/0124617 A1* | 5/2008 | Bjork .............................. | 429/90 |
| 2009/0087694 A1* | 4/2009 | Park .................................. | 429/8 |

(Continued)

FOREIGN PATENT DOCUMENTS

| | | |
|---|---|---|
| JP | 60-221955 | 11/1985 |
| JP | 11-125859 | 5/1999 |

(Continued)

OTHER PUBLICATIONS

Extended European Search Report dated Dec. 23, 2011 issued to corresponding European Patent Application No. 11170491.2, 4 pages.

(Continued)

*Primary Examiner* — Eugenia Wang
(74) *Attorney, Agent, or Firm* — Lewis Roca Rothgerber Christie LLP

(57) ABSTRACT

A battery pack includes a connection circuit board connected to the unit cells, a conductive lead drawn out from the connection circuit board, a printed circuit module having an opening into which the conductive lead is inserted, a solder portion formed by solder connection in which the conductive lead is inserted into the opening, wherein the conductive lead has an insertion portion inserted into the opening, a bent portion bent from the insertion portion, and a recess by which the insertion portion is divided.

13 Claims, 8 Drawing Sheets

(56) References Cited

U.S. PATENT DOCUMENTS

| | | |
|---|---|---|
| 2009/0130550 A1 | 5/2009 | Kim |
| 2009/0155684 A1* | 6/2009 | Jang et al. .................... 429/178 |
| 2010/0178549 A1 | 7/2010 | Moom |

FOREIGN PATENT DOCUMENTS

| | | |
|---|---|---|
| JP | 2005-005091 | 1/2005 |
| JP | 2007-294335 | 11/2007 |
| JP | 2009-176690 | 8/2009 |
| KR | 100659841 B1 | 12/2006 |
| KR | 10-2007-0033834 A | 3/2007 |
| KR | 10-2007-0075945 | 7/2007 |
| KR | 1020080039093 | 5/2008 |
| KR | 2009-0050179 | 5/2009 |
| KR | 10-2009-0104584 A | 10/2009 |
| KR | 10-2010-0082530 A | 7/2010 |

OTHER PUBLICATIONS

Patent Abstracts of Japan, and English machine translation of Japanese Publication 11-125859 dated May 11, 1999, listed above, (8 pages)

* cited by examiner

BATTERY PACK

CROSS-REFERENCE TO RELATED APPLICATIONS

This application claims the benefit of U.S. Provisional Application No. 61/377,392, filed on Aug. 26, 2010, in the United States Patent and Trademark Office, the disclosure of which is incorporated herein in its entirety by reference.

BACKGROUND

1. Field

Aspects of the present invention relate to a battery pack.

2. Description of Related Art

A battery pack typically includes a multi-cell assembly having a plurality of unit cells, and a printed circuit module (PCM).

The unit cells include a bare cell exclusively performing charging/discharging operations only.

The PCM includes a field effect transistor (FET) as a switching element that blocks current, a resistor, condenser, etc. The PCM controls charging/discharging operations of the unit cell, and prevents over-charge, over-discharge, over-current, etc.

The PCM is often electrically connected to the unit cell by soldering.

However, in order to increase a coupling force between the PCM and the unit cell, a large amount of solder may be used. Accordingly, a height of a solder portion may be substantial and a distance between the PCM and a case is minimal. Accordingly, space for mounting other elements in the PCM is minimal, that is, distances between each of the elements are narrow, which may make the assembly process complicated.

SUMMARY

Aspects of the present invention provide a battery pack having improved product reliability by minimizing a height of a solder portion when a multi-cell is connected to a printed circuit module (PCM) in series or parallel.

Aspects of the present invention also provide a battery pack having improved reliability in connecting a conductive lead to the PCM by increasing a contact area of the conductive lead of a connection circuit board and a solder portion when soldering the connection circuit board and the PCM.

According to one embodiment of the present invention, a battery pack is provided including a unit cell having a bare cell; an electrode tab extending from the bare cell; a circuit board electrically coupled to the electrode tab; and a conductive lead electrically coupled to the circuit board and protruding from the bare cell, wherein the conductive lead includes a base coupled to the circuit board; and an insertion portion protruding from the base and having a recess or a through hole; and a protective circuit module comprising an insulation board having an opening corresponding to each of the unit cells, wherein the insertion portion protrudes through the opening.

In one embodiment, the conductive lead has a stepped portion between the insertion portion and the base, wherein a width of the conductive lead is greater at the stepped portion than at the insertion portion. The battery pack may also include a printed circuit pattern that extends around a periphery of the opening, wherein the stepped portion abuts the printed circuit pattern or wherein the printed circuit pattern extends along opposing surfaces of the insulation board.

In one embodiment, the insertion portion includes a plurality of fingers separated by the recess and in another embodiment, the insertion portion is substantially T-shaped. Further, a ratio of an area of the recess and an area of the insertion portion is between about 29% and about 74%. Also, a portion of the recess may be within the opening and the recess may be substantially V-shaped. In one embodiment, a depth of the recess is greater than a thickness of the insulation board and in another embodiment, a length of the through hole is greater than a thickness of the insulation board.

In one embodiment, solder is in the through hole or in the recess to couple the insertion portion to the protective circuit module. Further, the recess may be on a side extending between the base and a distal end of the insertion portion.

As described above, in the connection circuit board of embodiments of the present invention and the battery pack including the same, when a multi-cell is connected to a printed circuit module in series or parallel, a height of a solder portion can be minimized.

In addition, in the connection circuit board of the present invention and the battery pack including the same, coupling reliability can be improved by maximizing a contact area of a conductive lead and a solder portion of the connection circuit board.

DETAILED DESCRIPTION

Hereinafter, a connection circuit board and a battery pack including the same according to embodiments of the present invention with reference to the accompanying drawings will be described in more detail.

A connection circuit board according to an aspect of the present invention and a battery pack including the same will first be described.

Figure 1:
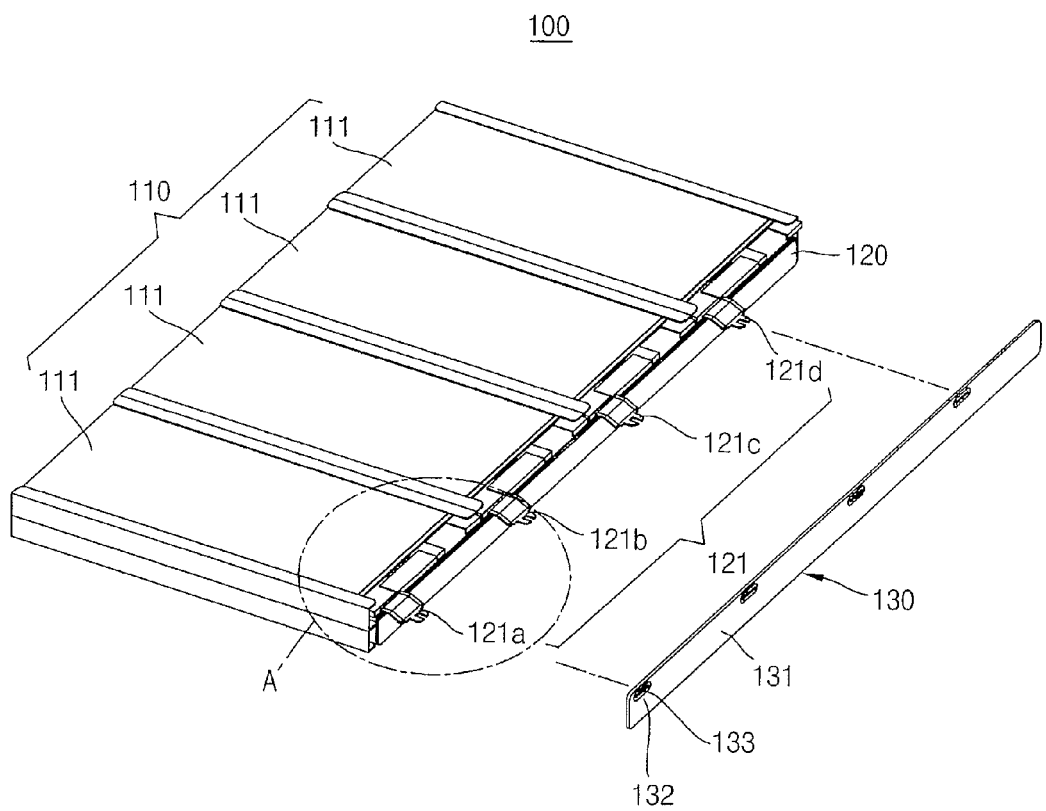
FIG. 1 is a perspective view of a battery pack according to an embodiment of the present invention.
Figure 2:
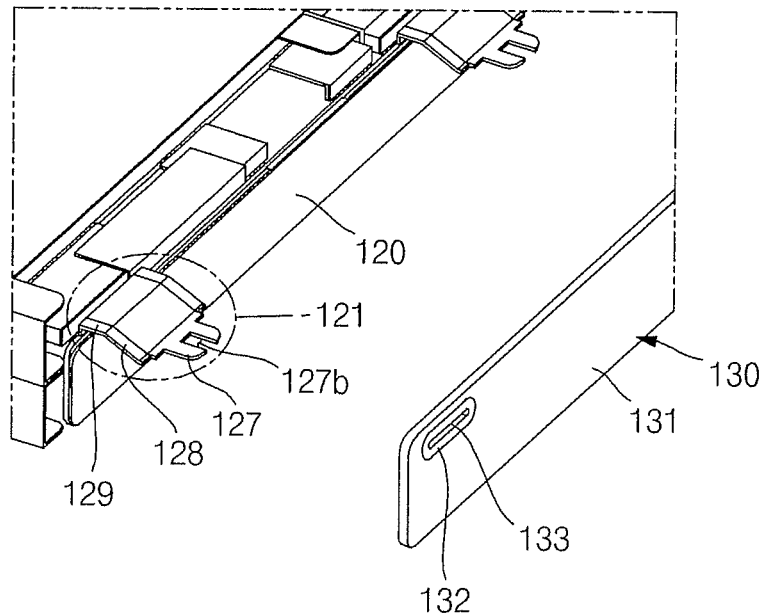
FIG. 2 is an enlarged perspective view of a portion A of FIG. 1.
Figure 3:
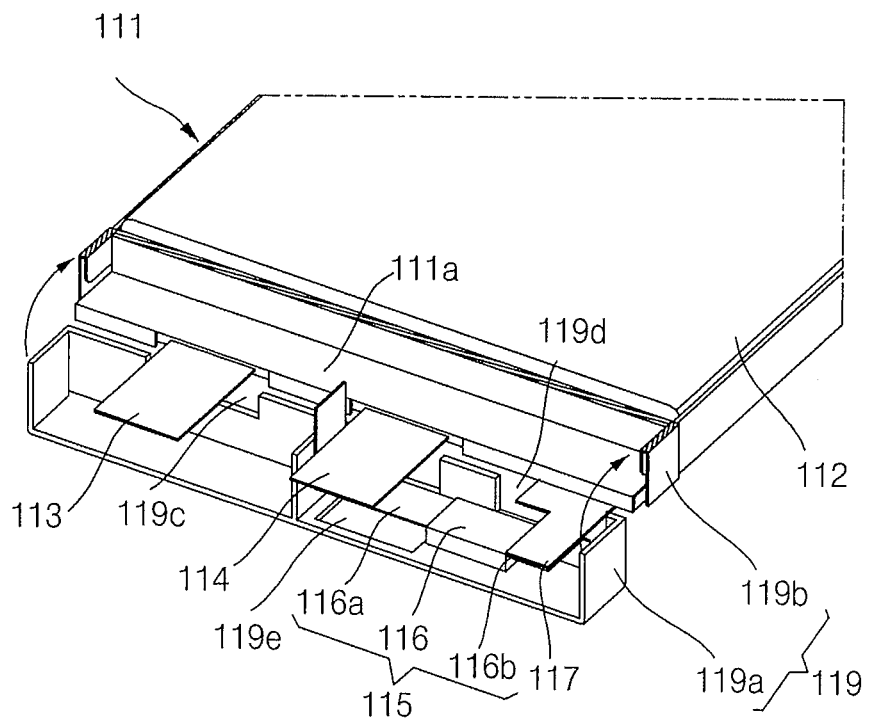
FIG. 3 is a partially perspective view of a unit cell of the battery pack shown in FIG. 1.
Figure 4:
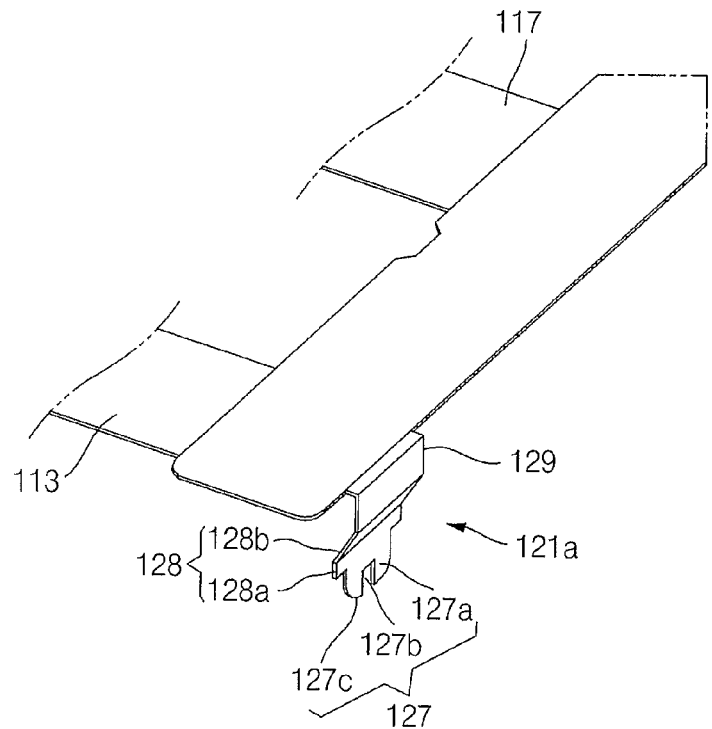
FIG. 4 is a partially perspective view illustrating a connection relationship between the unit cell shown in FIG. 3 and a connection circuit board.
Figure 5:
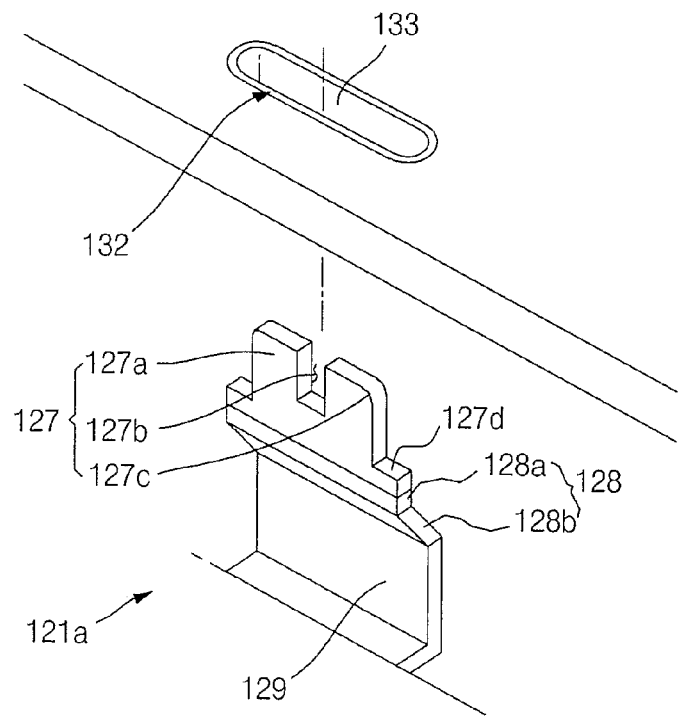
FIG. 5 is a perspective view illustrating a conductive lead and an opening shown in FIG. 1 spaced from each other.
Figure 6:
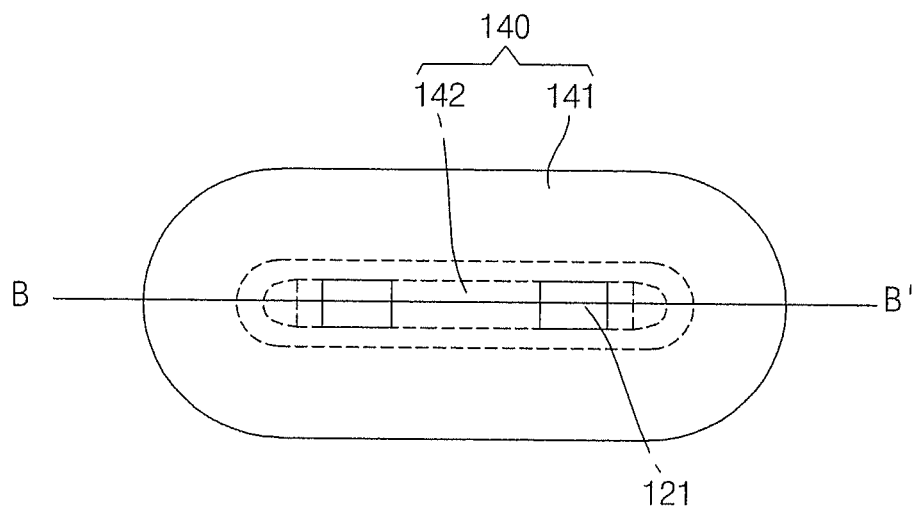
FIG. 6 is a front view of a soldering connection of the conductive lead and the opening of FIG. 5.
Figure 7:
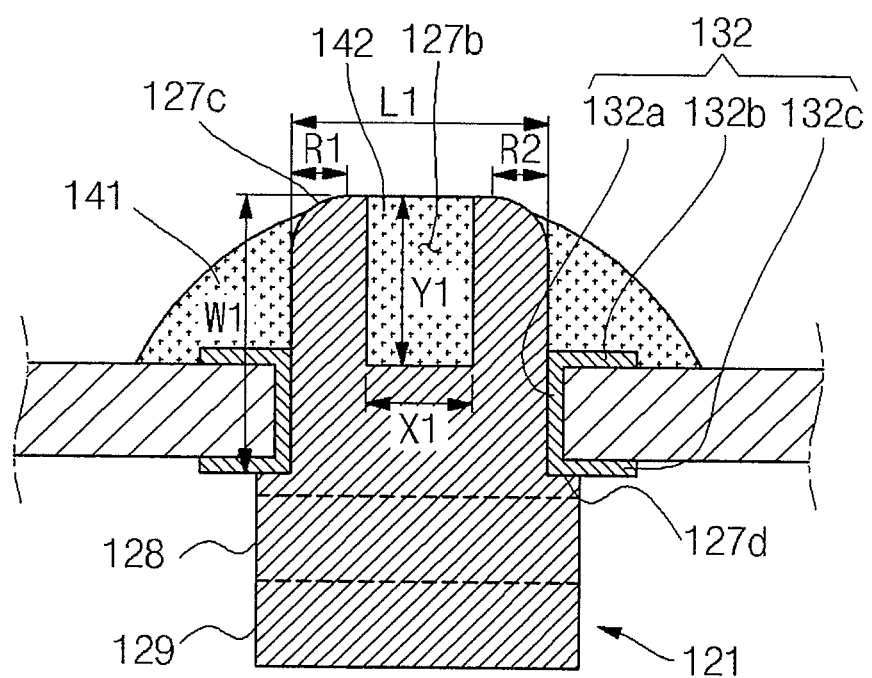
FIG. 7 is a vertical section view taken along the line B-B' of FIG. 6.

FIG. 1 is a perspective view of a battery pack according to an embodiment of the present invention, FIG. 2 is an enlarged perspective view of a portion A of FIG. 1, FIG. 3 is a partially perspective view of a unit cell constituting the battery pack shown in FIG. 1, FIG. 4 is a partially perspective view illustrating a connection relationship between the unit cell shown in FIG. 3 and a connection circuit board, FIG. 5 is a perspective view illustrating a conductive lead and an opening shown in FIG. 1 are separated from each other, FIG. 6 is a front view of a soldering connection of FIG. 5, and FIG. 7 is a vertical section view taken along the line B-B' of FIG. 6.

Referring to FIGS. 1 through 7, the battery pack 100 according to an embodiment of the present invention includes a multi-cell 110, a connection circuit board 120, a printed circuit module (PCM) 130, and a solder portion 140.

The multi-cell 110 and the printed circuit module 130 are electrically connected to each other. In the multi-cell 110, a negative electrode tab or a positive electrode tab is connected to the connection circuit board 120. The connection circuit board 120 is electrically connected to the PCM 130 and is fixed by the solder portion 140.

The multi-cell 110 includes a plurality of unit cells 111. The multi-cell 110 is configured such that the unit cells 111 connected in series or parallel to each other have a positive electrode and a negative electrode.

Each of the unit cells 111 includes a bare cell 112, a secondary protective element 115, and a cover 119. The bare cell 112 includes an electrode assembly, a first electrode tab 113, and a second electrode tab 114.

The bare cell 112 accommodates the electrode assembly and electrolyte. The bare cell 112 may be formed to have a shape that is the same as or similar to that of a general pouch-type battery, and a detailed description thereof will not be given.

The electrode assembly is configured by a negative electrode plate, a positive electrode plate, and a separator sequentially stacked and wound.

The first electrode tab 113 and the second electrode tab 114 have different polarities from each other. In other words, the first electrode tab 113 is electrically connected to the positive electrode plate of the electrode assembly, and the second electrode tab 114 is electrically connected to the negative electrode plate of the electrode assembly.

The secondary protective element 115 includes a functional element 116, a first lead 116a, a second lead 116b, and an element lead tab 117.

In one embodiment, the functional element 116 is a positive temperature coefficient (PTC) element. When the temperatures of the unit cell 111 rises, internal resistance increases and blocks current.

The first lead 116a is electrically connected to the second electrode tab 114. The second lead 116b is electrically connected to the element lead tab 117. The element lead tab 117 is plate-shaped and is made of the same material as the second electrode tab 114, or an electrically conductive material.

The cover 119 includes a cover body 119a and a cover fixing portion 119b.

In the cover 119, the secondary protective element 115 is positioned at a sealing part 111a of the unit cell 111 and an upper portion of the unit cells 111 is subjected to a finishing process. The cover body 119a is rotated about a plane close to the sealing part 111a of the unit cell 111 and is coupled to the cover fixing portion 119b. Here, when the cover body 119a is coupled to the cover fixing portion 119b, the second electrode tab 114 connected to the first lead 116 of the secondary protective element 115 is bent in a generally U shape.

The cover body 119a is formed to accommodate the secondary protective element 115. In addition, the cover body 119a includes a first extraction hole 119c and a second extraction hole 119d formed at a location close to the sealing part 111a of the first extraction hole 119c, the first extraction hole 119c through which the first electrode tab 113 extends, and the second extraction hole 119d through which the element lead tab 117 extends. An opening 119e allows for welding the second electrode tab 114 and the first lead 116 to each other.

The cover fixing portion 119b is formed on upper portions of the unit cells 111. The cover body 119a and the cover fixing portion 119b are coupled to each other and the upper portions of the unit cells 111 are finished.

The connection circuit board 120 is connected to a plurality of wire patterns formed therein, and a conductive lead 121 extending therefrom. The conductive lead 121 may includes a number of conductive leads 121a, 121b, 121c, and 121d corresponding to the number of unit cells. Additionally, a general printed circuit board (PCB) may be used as the connection circuit board 120. The connection circuit board 120 may include wire patterns thereon, like in a general flexible printed circuit board (FPCB).

The connection circuit board 120 is electrically connected to the first electrode tab 113 and the element lead tab 117 extending from the unit cell 111.

The conductive lead 121 is shaped of a plate made of a material having electrical conductivity, and includes an insertion portion 127, a bent portion 128, and an extending portion or base 129. The conductive lead 121 is electrically connected to the PCM 130.

The insertion portion 127 includes a fixing portion or fingers 127a, a recess 127b, a slanting portion 127c, and a stepped portion 127d.

The fingers 127a are shaped of a plate and have a slanting portion 127c whose ends are chamfered.

In addition, a recess 127b passing through toward the connection circuit board 120 with respect to the ends of the fingers 127a is formed. With reference to FIG. 7, a width X1 of the recess 127b is smaller than a value obtained by subtracting widths of slanting portions 127c at opposite sides from the entire width of the fingers 127a. A depth Y1 of the recess 127b coincides with an upper extension line of the PCB 130. In one embodiment, the recess 127b has a rectangular shape having constant depth Y1 and width X1.

The recess 127b increases a contact area of the insertion portion 127 and the solder portion 140, thereby improving a coupling force therebetween. The contact area is a sum of an internal area of the recess 127b and an area of the fingers 127a obtained by subtracting the area of the recess 127b from the area of the insertion portion 127.

The recess 127b may have the depth Y1 to have an increased strength. Here, a ratio of the area of the recess 127b to the area of insertion portion 127 of the conductive lead 121 is between about 29% and about 74%.

The area of the recess 127b is calculated based on its width X1 and depth Y1. The width X1 of the recess 127b is smaller than a value obtained by subtracting the widths of the slanting portions 127c at opposite sides from the entire width of the fingers 127a. For example, when the entire width L1 of the fingers 127a is 3 mm, the width X1 of the internal space of the recess 127b is 3 mm or less.

Assuming that the width X1 and depth Y1 of the recess 127b are 1 mm and 2.4 mm, respectively, the entire width L1 of the fingers 127a is 3 mm and an insertion height W1 is 2.75 mm, the area ratio may be calculated using the relationship $(X1 \times Y1)/(L1 \times W1)$. In the illustrated embodiment, the area ratio is approximately 29%.

In addition, the slanting portion 127b is formed by rounding both ends of the fingers 127a. The rounded surfaces of the slanting portion 127b may minimize a height of the solder portion 140 when the PCB 130 and the fingers 127a are coupled to each other.

Further, the insertion portion 127 has a stepped portion 127d so as to contact a bottom portion of the PCB 130. The stepped portion 127d is formed to have a width greater than the entire width of the insertion portion 127 at a location where it is formed to have a thickness equal to or greater than a thickness of the PCB 130 at both ends of the insertion portion 127.

The bent portion 128 includes a first bent portion 128a and a second bent portion 128b.

The first bent portion 128a is bent at an angle from and extends from the stepped portion 127d. The bending range is between about 30 degrees and 90 degrees with respect to the angle in which the first bent portion 128a is inserted into the printed circuit module 130. In one embodiment, an angle of the first bent portion 128a may be flexible to facilitate assembly of the battery pack.

The second bent portion 128b is bent at an angle from and extends from the first bent portion 128a. In one embodiment, the bending range of the second bent portion 128b may be substantially the same with that of the first bent portion 128a.

In addition, the first bent portion 128a and the second bent portion 128b are bent to substantially prevent the solder portion 140 from an upper portion of the PCB 130 from flowing downward.

The base 129 is formed to extend from the second bent portion 128b. When the insertion portion 127 is inserted into the PCM 130, the base 129 facilitates assembly by upwardly or downwardly moving in view of the connection circuit board 120.

The PCM 130 includes an insulation board 131, a printed circuit pattern 132, and circuit elements. In addition, the PCM 130 may further include a connector.

The insulation board 131 has an opening 133 passing therethrough. The insulation board 131 is made of a resin-based material such as epoxy resin or bakelite. The insulation board 131 may include a plurality of compressed layers.

The opening 133 is formed to have a tetragonal plane, and in one embodiment, a rectangular plane having a width-to-depth ratio. The opening 133 is a portion into which the insertion portion 127 is inserted. In the illustrated embodiment, the opening 133 has its width that is longer than its depth.

In addition, the opening 133 may have a margin space provided at its width and depth to allow the fingers 127a to be inserted therein. In one embodiment, the margin space is provided to prevent a solder material from flowing downwardly through the bent portion 128. In addition, a margin space provided at either end of the fingers 127a is preferably smaller than the width of the stepped portion 127d.

The printed circuit pattern 132 may be formed on a surface of the insulation board 131 by, for example, plating. The printed circuit pattern 132 may be formed to have various patterns according to the design of the PCM 130. In addition, the printed circuit pattern 132 may be formed on both of the top and bottom surfaces of the insulation board 131. The printed circuit pattern 132 may also be formed on an intermediate layer of the insulation board 131. FIG. 3 illustrates an example printed circuit pattern formed around the opening 133.

The printed circuit pattern 132 includes an inner pattern 132a, an upper pattern 132b, and a lower pattern 132c.

The inner pattern 132a is formed on the internal surface of the opening 133.

The upper pattern 132b is led to the inner pattern 132a and extends away from the inner pattern 132a on the top surface of the insulation board 131.

The lower pattern 132c is led to the inner pattern 132a and extends away from the inner pattern 132a on the bottom surface of the insulation board 131.

Since the inner pattern 132a, the upper pattern 132b, and the lower pattern 132c integrally cover the upper, middle and lower portions of the opening 133, coupling forces between each of the inner pattern 132a, the upper pattern 132b and the lower pattern 132c, and the insulation board 131 are improved. Therefore, a coupling force between the solder portion 140 connected to the opening patterns 132a and 132b and the PCM 130 is also improved.

The circuit elements are placed on the insulation board 131 and are electrically connected to each other through the printed circuit pattern 132. The circuit elements measure voltages of the multi-cell 110 and control charging/discharging of the multi-cell 110 according to the charge/discharge state of the multi-cell 110. More specifically, the circuit elements include a charge field effect transistor (FET), a discharge FET, a positive temperature coefficient (PTC) element, and a controller.

The connector is placed on the top surface of the insulation board 131 and is electrically connected to the printed circuit pattern 132. In addition, the connector may be electrically connected to a battery connection terminal of a portable electronic device. In this case, the connector is exposed to the outside of a case surrounding the multi-cell 110 and the PCM 130.

Referring to FIG. 6, the solder portion 140 includes a first solder portion 141 and a second solder portion 142. The solder portion 140 is formed by soldering the PCM 130 and the insertion portion 127. The first solder portion 141 is formed outside the fingers 127a, and the second solder portion 142 is formed in the recess 127b. Here, the first solder portion 141 and the second solder portion 142 are integrally connected to increase a coupling force therebetween.

Since the first solder portion 141 and the second solder portion 142 are integrally formed, the solder portion 140 has an increased coupling force compared to a case where only the first solder portion 141 is provided. Therefore, an amount of solder induced into the solder portion 140 may be reduced.

Next, a battery pack according to another embodiment of the present invention will be described.

Figure 8:
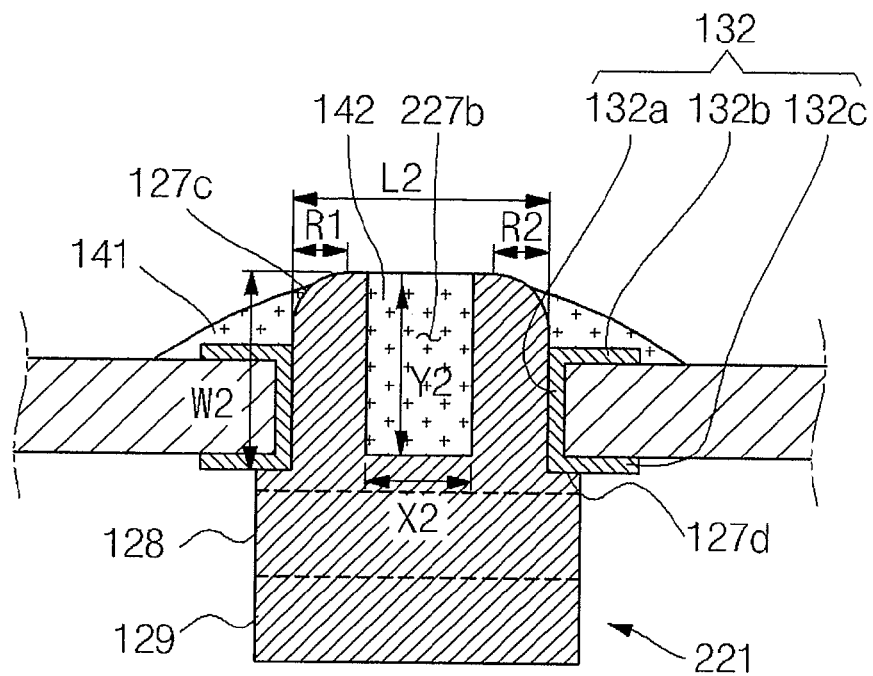
FIG. 8 is a vertical section view illustrating a portion of a battery pack according to another embodiment of the present invention, generally corresponding to the portion of the battery pack shown in FIG. 7.

FIG. 8 is a vertical section view illustrating a portion of a battery pack according to another embodiment of the present invention, corresponding to FIG. 7, in which a printed circuit module (PCM) and a conductive lead of a connection circuit board are connected to each other.

The battery pack according to the illustrated embodiment includes unit cells 111, a connection circuit board 120, a PCM 130 and a solder portion 140. In the illustrated embodiment, since the unit cells 111, the connection circuit board 120, the PCM 130 and the solder portion 140 are the same as above with reference to FIG. 7, functional elements that are the same as or similar to those shown in FIG. 7 are denoted by the same reference numerals, and detailed descriptions thereof will not be given.

In the conductive lead 221 according to the illustrated embodiment, a recess 227b has a constant width, and, a depth Y2 ranging from either end of the insertion portion 227 to a bottom portion of the PCM 130, as shown in FIG. 7. Here, the depth Y2 may be set such that the recess 227b may not extend beyond the bottom portion of the PCM 130. If the recess 227b extends beyond a lower extension line of the PCM 130, the solder inserted into the recess 227b may flow out.

The recess 227b may be formed to have the maximum depth Y2 so as to increase coupling reliability of the first solder portion 141, the second solder portion 142 and the insertion portion 227 at the top portion of the PCM 130. Here, a ratio of the area of the recess 227b to the area of insertion portion 227 of the conductive lead 321 is between about 29 to 74%.

The area of the recess 227b is calculated based on the width X2 and depth Y2 of the internal space of the recess 227b. Assuming that the width X2 and depth Y2 of the recess 227b are 1.4 mm and 2.6 mm, respectively, the entire width L21 of the fixing portion 227a is 2 mm and an insertion height W1 is 2.45 mm, the area ratio may be calculated using the relationship (X2×Y2)/(L2×W2). In the illustrated embodiment, the area ratio is approximately 74%.

A battery pack according to still another embodiment of the present invention will now be described.

Figure 9:
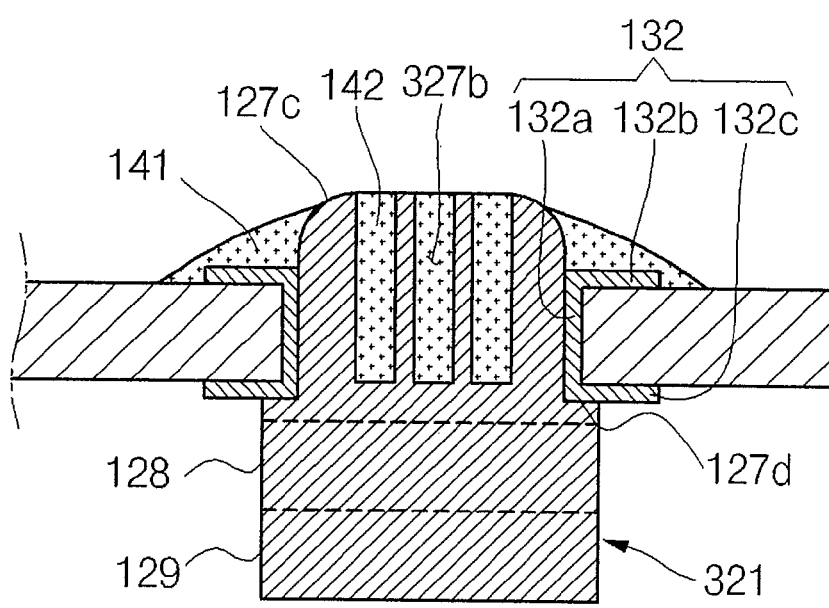
FIG. 9 is a vertical section view illustrating a portion of a battery pack according to still another embodiment of the present invention, generally corresponding to the portion of the battery pack shown in FIG. 7.

FIG. 9 is a vertical section view illustrating a portion of a battery pack according to still another embodiment of the present invention, in which a printed circuit module (PCM) 130 and a conductive lead 321 of a connection circuit board 120 are connected to each other.

The battery pack according to the illustrated embodiment includes unit cells 111, a connection circuit board 120, a PCM 130 and a solder portion 140.

A battery pack according to still another embodiment of the present invention will now be described.

FIG. 9 is a vertical section view illustrating a portion of a battery pack according to still another embodiment of the present invention, in which a printed circuit module (PCM) 130 and a conductive lead 321 of a connection circuit board 120 are connected to each other.

The battery pack according to the illustrated embodiment includes unit cells 111, a connection circuit board 120, a PCM 130 and a solder portion 140.

In the conductive lead 321 according to the illustrated embodiment, a plurality of recesses 327b are provided. Accordingly, in the following description, the battery pack according to the illustrated embodiment will be described with regard to the recesses 327b of the connection circuit board 120. In FIG. 9, only the connection circuit board 120, the PCM 130 and the solder portion 140 are illustrated. Since the PCM 130 and the solder portion 140 are the same as above with reference to FIG. 1 or 7, functional elements that are the same as or similar to those shown in FIG. 1 or 7 are denoted by the same reference numerals, and detailed descriptions thereof will not be given.

Accordingly, in the following description, the battery pack according to the illustrated embodiment will be described with regard to the recesses 327b of the connection circuit board 120. In FIG. 9, only the connection circuit board 120, the PCM 130 and the solder portion 140 are illustrated. PCM 130 and the solder portion 140 are the same as above with reference to FIG. 7, functional elements that are the same as or similar to those shown in FIG. 1 or 7 are denoted by the same reference numerals, and detailed descriptions thereof will not be given.

In the conductive lead 321 according to the illustrated embodiment, the plurality of recesses 327b are provided to increase coupling reliability of the first solder portion 141, the second solder portion 142 and the insertion portion 127 at the top portion of the PCM 130. Here, a ratio of the area of the recess 327b to the area of insertion portion 127 of the conductive lead 321 is between about 29 to 74%.

A battery pack according to still another embodiment of the present invention will now be described.

Figure 10:
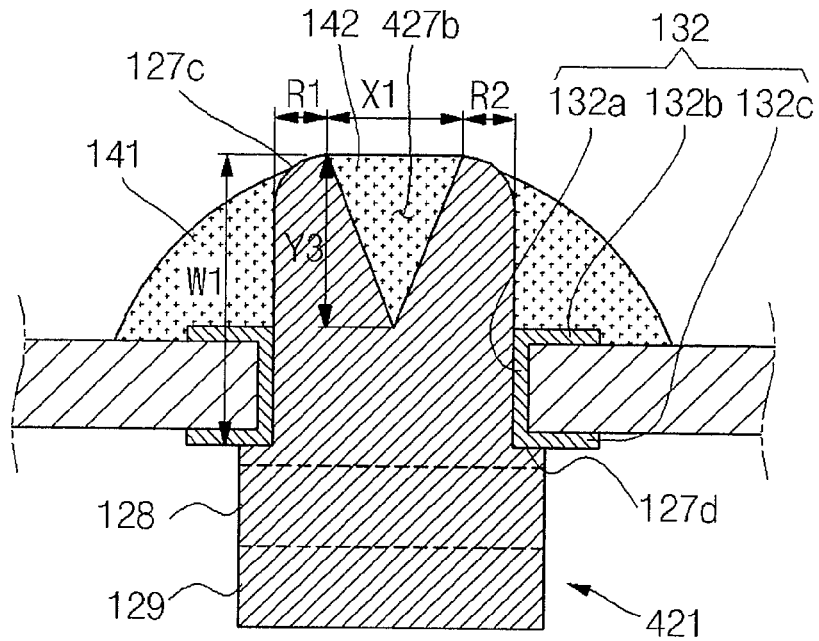
FIG. 10 is a vertical section view illustrating a portion of a battery pack according to still another embodiment of the present invention, generally corresponding to the portion of the battery pack shown in FIG. 7.

FIG. 10 is a vertical section view illustrating a portion of a battery pack according to still another embodiment of the present invention, in which a printed circuit module (PCM) 130 and a conductive lead 421 of a connection circuit board 120 are connected to each other.

The battery pack according to the illustrated embodiment includes unit cells 111, a connection circuit board 120, a PCM 130 and a solder portion 140.

In the conductive lead 421 according to the illustrated embodiment, a recess 427b has a generally V-shape. Accordingly, in the following description, the battery pack according to the illustrated embodiment will be described with regard to the recess 427b of the connection circuit board 120. In FIG. 10, only the connection circuit board 120, the PCM 130 and the solder portion 140 are illustrated. In addition, functional elements that are the same as or similar to those shown in FIG. 1 or 7 are denoted by the same reference numerals, and detailed descriptions thereof will not be given.

The recess 427b is formed such that a width of its internal space gradually decreases toward the interior side of the conductive lead 421. The recess 427b is formed to range from the center of its width to the top portion of the PCM 130 to be connected to the first solder portion 141, so that a contact area between the conductive lead 421 and the solder portion 140 may be maximized.

Therefore, in order to increase the reliability of coupling the connection circuit board 120 with the PCM 130, the recess 427b is formed to have the minimum depth Y3. Since the conductive lead 421 has the recess 427b having a reduced depth, the strength of the conductive lead 421 may be comparatively increased.

In one embodiment, a ratio of the area of the recess 427*b* to the area of an insertion portion 127 of the conductive lead 421 is between about 29 to 74%. Since the recess 427*b* having the minimum depth Y3 is the same as described above with reference to FIG. 5, functional elements that are the same as or similar to those of the previous embodiment are denoted by the same reference numerals, and detailed descriptions thereof will not be given. In the illustrated embodiment, the area ratio is approximately 29%.

A battery pack according to still another embodiment of the present invention will now be described.

Figure 11:
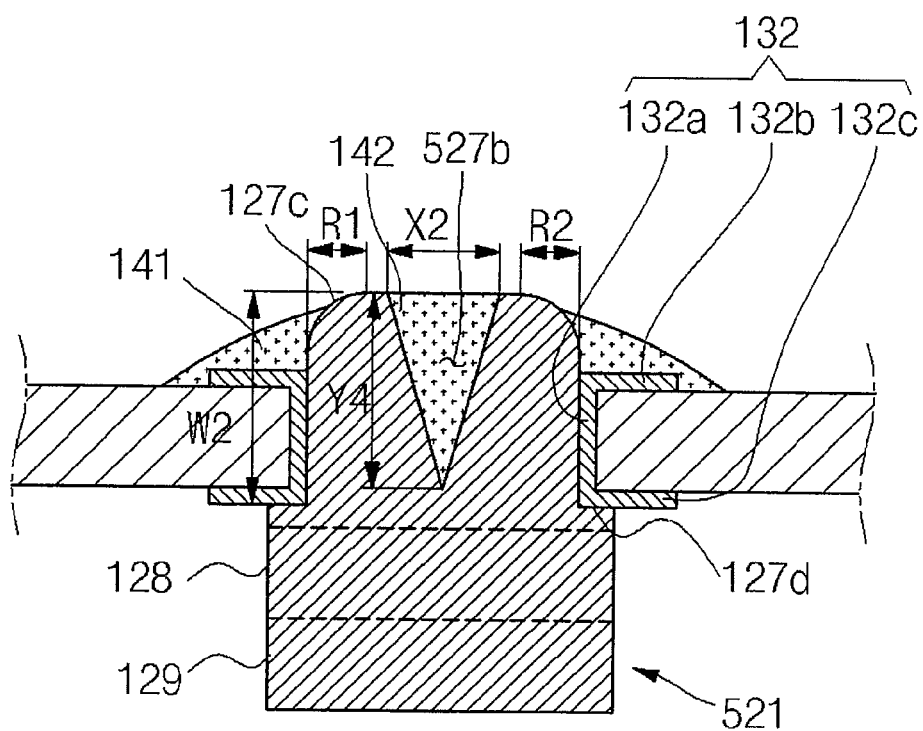
FIG. 11 is a vertical section view illustrating a portion of a battery pack according to still another embodiment of the present invention, generally corresponding to the portion of the battery pack shown in FIG. 10.

FIG. 11 is a vertical section view illustrating a portion of a battery pack according to still another embodiment of the present invention, in which a printed circuit module (PCM) 130 and a conductive lead 521 of a connection circuit board 120 are connected to each other.

The battery pack according to the illustrated embodiment includes unit cells 111, a connection circuit board 120, a PCM 130 and a solder portion 140.

A depth of a recess 527*b* according to the illustrated embodiment may become maximized when the insertion portion 127 is inserted into an opening 133. Here, the maximum depth Y4 corresponds to a depth ranging up to a bottom portion of the PCM 130, as shown in FIG. 11. If the recess 527*b* extends beyond a lower extension line of the PCM 130, the solder inserted into the recess 527*b* may flow out.

The recess 527*b* is formed to range from the center of its width to the bottom portion of the PCM 130 to be connected to the first solder portion 141, so that a contact area between the conductive lead 521 and the solder portion 140 may become maximized.

Here, a ratio of the area of the recess 527*b* to the area of an insertion portion 127 of the conductive lead 521 is between about 29 and 74%. Since the recess 527*b* having the maximum depth Y4 is the same as described above with reference to FIG. 8, functional elements that are the same as or similar to those of the previous embodiment are denoted by the same reference numerals, and detailed descriptions thereof will not be given. In the illustrated embodiment, the area ratio is approximately 29%. The area of the recess 527*b* is calculated based on the shape of the recess 527*b*, and a detailed explanation thereof will be omitted. In the illustrated embodiment, the area ratio may be approximately 74% or less.

A battery pack according to still another embodiment of the present invention will now be described.

Figure 12:
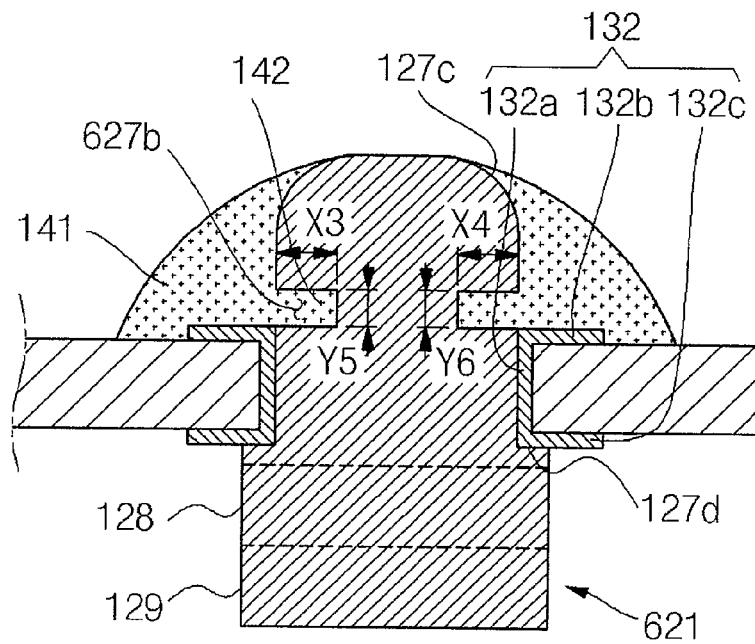
FIG. 12 is a vertical section view illustrating a portion of a battery pack according to still another embodiment of the present invention, generally corresponding to the portion of the battery pack shown in FIG. 7.

FIG. 12 is a vertical section view illustrating a portion of a battery pack according to still another embodiment of the present invention, in which a printed circuit module (PCM) 130 and a conductive lead 621 of a connection circuit board 120 are connected to each other.

The battery pack according to the illustrated embodiment includes unit cells 111, a connection circuit board 120, a PCM 130 and a solder portion 140.

Referring to FIG. 12, the conductive lead 621 is distinguished from the conductive leads of the previous embodiments, in view of a configuration of a recess 627*b*. Accordingly, in the following description, the battery pack according to the illustrated embodiment will be described with regard to the recess 627*b* of the connection circuit board 120. In FIG. 12, only the connection circuit board 120, the PCM 130 and the solder portion 140 are illustrated. Functional elements that are the same as or similar to those shown in FIG. 1 or 7 are denoted by the same reference numerals, and detailed descriptions thereof will not be given.

The recess 627*b* may be formed at either side surface end of the insertion portion 127*a*. In one embodiment, one or more of the recesses 627*b* may be formed in one direction or opposite directions of the fingers 127*a*. The recess 627*b* may be formed on a side of the insertion portion 127 extending between the upper pattern and a distal end of the insertion portion. Therefore, the second solder portion 142 formed in the recess 627*b* is connected to a first solder portion 141 so as to increase a contact area between the second solder portion 142 and the insertion portion 127*a*. Since the conductive lead 621 has the recesses 627*b* having reduced widths X3 and X4 and depths Y5 and Y6, the strength of the conductive lead 621 may be comparatively increased.

Here, a ratio of the area of the recess 627*b* to the area of an insertion portion 127 of the conductive lead 621 is between about 29% and 74%.

The area of the recess 627*b* is obtained based on two widths X3 and X4 and depths Y5 and Y6 of the recess 627*b*. The sum of the two widths X3 and X4 of the recess 627*b* is smaller than the entire width of the insertion portion 127. For example, when the entire width of the insertion portion 127 is 4 mm, the sum of the two widths X3 and X4 of the recess 627*b* is 4 mm or less.

Alternatively, the two widths X3 and X4 of the recess 627*b* may be different from each other.

In the illustrated embodiment, the area ratio may be calculated using the relationship (Minimum area of recess)/(Maximum area of insertion portion). The area may be calculated based on the shape of the recess 627*b*, and a detailed explanation thereof will be omitted.

A battery pack according to still another embodiment of the present invention will now be described.

Figure 13:
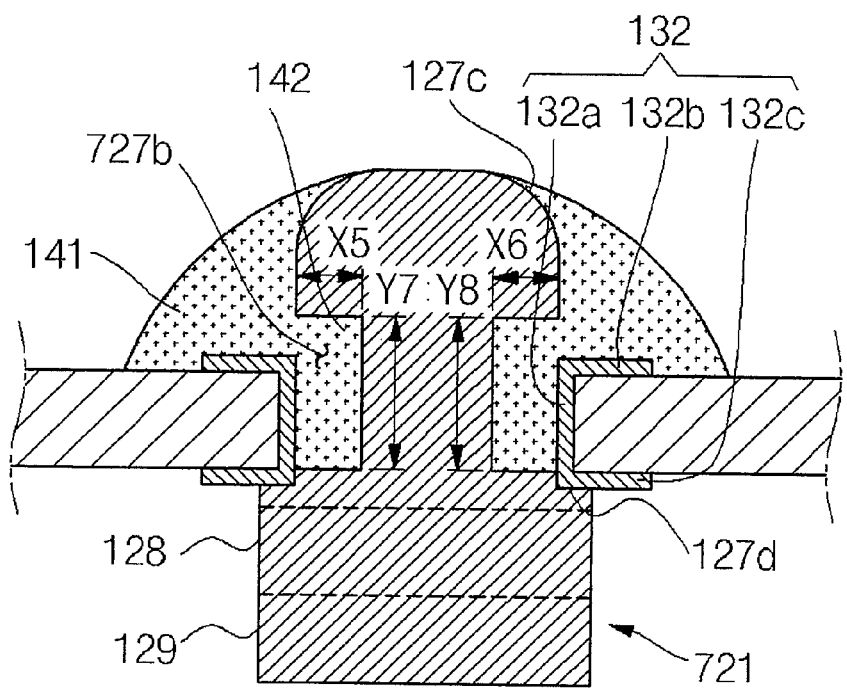
FIG. 13 is a vertical section view illustrating a portion of a battery pack according to still another embodiment of the present invention, generally corresponding to the portion of the battery pack shown in FIG. 12.

FIG. 13 is a vertical section view illustrating a portion of a battery pack according to still another embodiment of the present invention, in which a printed circuit module (PCM) 130 and a conductive lead 721 of a connection circuit board 120 are connected to each other.

The battery pack according to the illustrated embodiment includes unit cells 111, a connection circuit board 120, a PCM 130 and a solder portion 140.

Referring to FIG. 13, the conductive lead 721 is distinguished from the conductive leads of the previous embodiments, in view of a configuration of a recess 727*b*. For example, the recess 727*b* has widths X5 and X6, and depths Y7 and Y8, which area symmetrical to each other, but aspects of the invention are not limited to the illustrated embodiment with respect to the length and number of the recesses 727*b*.

As shown in FIG. 13, the depths Y7 and Y8 of the recess 727*b* may not extend beyond the bottom portion of the PCM 130. If the recess 727*b* extends beyond a lower extension line of the PCM 130, the solder inserted into the recess 727*b* may flow out.

Here, a ratio of the area of the recess 727*b* to the area of an insertion portion 127 of the conductive lead 721 is between about 29 to 74%.

The area of the recess 727*b* is obtained based on two widths X5 and X6 and depths Y7 and Y8 of the recess 727*b*. The sum of the two widths X5 and X6 of the recess 727*b* is smaller than the entire width of the insertion portion 127. For example, when the entire width of the insertion portion 127 is 4 mm, the sum of the two widths X5 and X6 of the recess 727*b* is 4 mm or less.

In the illustrated embodiment, the area ratio may be calculated using the relationship (Minimum area of recess)/(Maximum area of insertion portion). The area may be calculated based on the shape of the recess 727b, and a detailed explanation thereof will be omitted.

A battery pack according to still another embodiment of the present invention will now be described.

Figure 14:
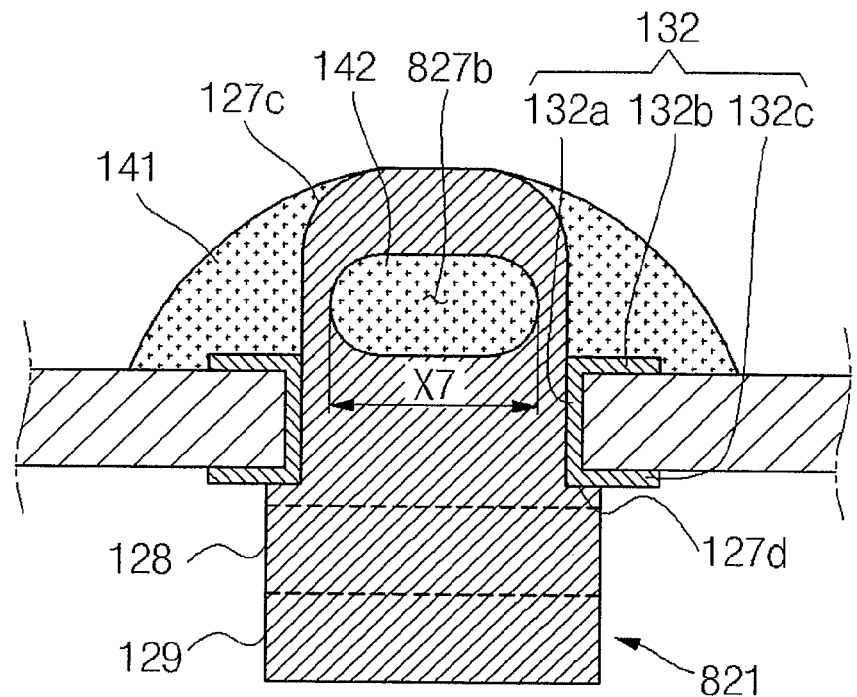
FIG. 14 is a vertical section view illustrating a portion of a battery pack according to still another embodiment of the present invention, generally corresponding to the portion of the battery pack shown in FIG. 7.

FIG. 14 is a vertical section view illustrating a portion of a battery pack according to still another embodiment of the present invention, in which a printed circuit module (PCM) 130 and a conductive lead 821 of a connection circuit board 120 are connected to each other.

The battery pack according to the illustrated embodiment includes unit cells 111, a connection circuit board 120, a PCM 130 and a solder portion 140.

Referring to FIG. 14, the conductive lead 821 is distinguished from the conductive leads of the previous embodiments, in view of a configuration of an opening or a through hole 827b. Accordingly, in the following description, the battery pack according to the illustrated embodiment will be described with regard to the through hole 827b of the connection circuit board 120. In FIG. 14, only the conductive lead 821, the PCM 130 and the solder portion 140 are illustrated. Functional elements that are the same as or similar to those shown in FIG. 1 or 7 are denoted by the same reference numerals, and detailed descriptions thereof will not be given.

In the illustrated embodiment, the through hole 827b may be formed on an insertion portion 127a in the form of a through groove or opening of a circular shape. At least one of the circular through hole 827b may be formed in a circular or oval shape. The conductive lead 821 is formed to have the minimum area of the recess 821b. Since the conductive lead 821 occupies the minimum area of the recess 821a, the strength of the conductive lead 821 may be comparatively increased.

Here, a ratio of the area of the through hole 827b to the area of an insertion portion 127 of the conductive lead 821 is between about 29 to 74%.

With respect to the area of the internal space of the through hole 827b, a width X7 of the through hole 827b formed at either side surface end of the is smaller than the through hole 827b is smaller than the entire width of the insertion portion 127.

In the illustrated embodiment, the area ratio may be calculated using the relationship (Minimum area of recess)/ (Maximum area of insertion portion). The area may be calculated based on the shape of the through hole 827b, and a detailed explanation thereof will be omitted. In the illustrated embodiment, the area ratio is approximately 29% or greater.

A battery pack according to still another embodiment of the present invention will now be described.

Figure 15:
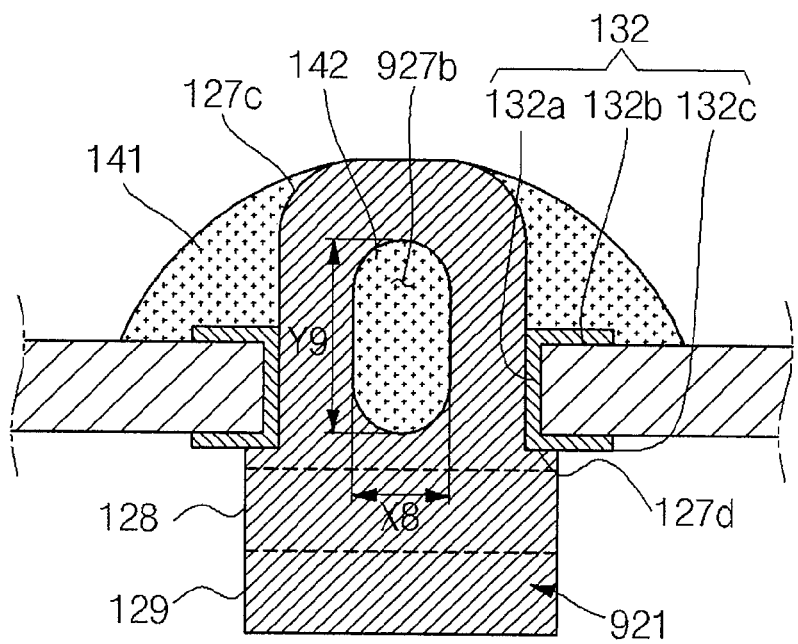
FIG. 15 is a vertical section view illustrating a portion of a battery pack according to still another embodiment of the present invention, generally corresponding to the portion of the battery pack shown in FIG. 14.

FIG. 15 is a vertical section view illustrating a portion of a battery pack according to still another embodiment of the present invention, in which a printed circuit module (PCM) 130 and a conductive lead 921 of a connection circuit board 120 are connected to each other.

The battery pack according to the illustrated embodiment includes unit cells 111, a connection circuit board 120, a PCM 130 and a solder portion 140.

Referring to FIG. 15, the conductive lead 921 is distinguished from the conductive leads of the previous embodiments, in view of a configuration of a recess or through hole 927b. Accordingly, in the following description, the battery pack according to the illustrated embodiment will be described with regard to the through hole 927b of the connection circuit board 120. In FIG. 15, only the connection circuit board 120, the PCM 130 and the solder portion 140 are illustrated. Functional elements that are the same as or similar to those shown in FIG. 1 or 7 are denoted by the same reference numerals, and detailed descriptions thereof will not be given.

In modifications of the illustrated embodiment, it will be appreciated that the number and sizes of through hole 927b may be varied on finger 127a. Here, the through hole 927b is formed to have the maximum area. In addition, the through hole 927b may be formed such that an outer circumferential surface of the through hole 927b does not extend beyond a lower extension line of the PCM 130. If the outer circumferential surface of the through hole 927b extends beyond the lower extension line of the PCM 130, the solder inserted into the recess 727b may flow out.

Here, a ratio of the area of the through hole 927b to the area of an insertion portion 127 of the conductive lead 921 is between about 29% to about 74%.

With respect to the area of the internal space of the through hole 927b, in one embodiment, a width X8 of the through hole 927b is less than the entire width of the insertion portion 127, and a depth Y9 of the through hole 927b less than a height of the fingers 127a.

In the illustrated embodiment, the area ratio may be calculated using the relationship (Minimum area of recess)/ (Maximum area of insertion portion). The area may be calculated based on the shape of the through hole 927b, and a detailed explanation thereof will be omitted. In the illustrated embodiment, the area ratio is approximately 74% or less.

Although the present invention has been described with reference to the preferred examples, the foregoing disclosure should be interpreted as illustrative only and it should be understood that various modifications and variations can be easily made by those skilled in the art without departing from the spirit of the invention.

DESCRIPTION OF THE SYMBOLS IN MAIN PORTIONS OF THE DRAWINGS

| | |
|---|---|
| 111: Unit cell | 112: Bare cell |
| 120: Connection circuit board | |
| 121, 221, 321, 421, 521, 621, 721, 821, 921: Conductive Lead | |
| 127: Insertion portion | 127a: Fixing portion |
| 127b, 227b, 3221b, 427b, 527b, 627b, 727b, 827b, 927b: Recess | |
| 127c: Slanting Portion | 127d: Stepped Portion |
| 128: Bent Portion | 129: Base |
| 130: Printed Circuit Module | 131: Insulation Board |
| 133: Opening | 132: Printed Circuit Pattern |
| 140: Solder Portion | |
| 141: First Solder Portion | 142: Second Solder Portion |

What is claimed is:
1. A battery pack comprising:
   a unit cell comprising:
      a bare cell;
      an electrode tab extending from the bare cell;
      a connection circuit board electrically coupled to the electrode tab and having a planar surface facing the bare cell; and
      a conductive lead electrically coupled to the electrode tab through the connection circuit board, wherein the conductive lead comprises:
         a base coupled to the connection circuit board and having a longitudinal axis extending in a first direction;
         an insertion portion protruding from the base and having a plurality of fingers and a recess extending through an entire thickness of the insertion portion and defined by an interior edge of the fingers, wherein the insertion portion longitudinally extends in the first direction away from the connection circuit board, wherein the insertion portion is not bent; and a stepped portion between the insertion portion and the base, the stepped portion having a width greater than a width of the insertion portion and contacting the planar surface of the connection circuit board; and a protective circuit module comprising an insulation board having an opening corresponding to the unit cell, wherein each of the fingers extends through the opening to protrude therefrom and wherein the interior edge of the fingers is entirely spaced from the protective circuit module, wherein a depth of the recess is greater than a thickness of the insulation board.

2. The battery pack of claim 1, wherein a printed circuit pattern extends around a periphery of the opening.

3. The battery pack of claim 2, wherein the stepped portion abuts the printed circuit pattern.

4. The battery pack of claim 2, wherein the printed circuit pattern extends along opposing surfaces of the insulation board.

5. The battery pack of claim 1, wherein a ratio of an area of the recess and an area of the insertion portion is between about 29% and about 74%.

6. The battery pack of claim 1, wherein a portion of the recess is within the opening.

7. The battery pack of claim 1, wherein the recess comprises a plurality of recesses.

8. The battery pack of claim 1, wherein the recess is V-shaped.

9. The battery pack of claim 1, wherein the solder is in the recess to couple the insertion portion to the protective circuit module.

10. The battery pack of claim 1, wherein the conductive lead is coupled to the protective circuit module.

11. The battery pack of claim 1, wherein adjacent ones of the fingers are separated by the recess, and wherein solder is located within the recess.

12. The battery pack of claim 1, wherein the conductive lead further comprises a bent portion between the base and the insertion portion, the bent portion extending at an angle from the base, and the bent portion positioned at the opening when the conductive lead is soldered to the protective circuit module.

13. A battery pack comprising:
a unit cell comprising:
a bare cell; and
a conductive lead electrically coupled to the bare cell, wherein the conductive lead comprises:
a base electrically coupled to the bare cell and having a longitudinal axis extending in a first direction;
an insertion portion protruding from the base and having a plurality of fingers and a recess extending through an entire thickness of the insertion portion and defined by an interior edge of the fingers, wherein the insertion portion longitudinally extends in the first direction away from the bare cell, wherein the insertion portion is not bent;
a stepped portion between the insertion portion and the base, the stepped portion having a width greater than a width of the insertion portion; and
a protective circuit module comprising an insulation board having an opening corresponding to the unit cell, wherein each of the fingers extend through the opening to protrude therefrom and wherein the interior edge of the fingers is entirely spaced from the protective circuit module,
wherein a depth of the recess is greater than a thickness of the insulation board.

* * * * *